United States Patent [19]
Olivo et al.

[11] Patent Number: 5,594,703
[45] Date of Patent: Jan. 14, 1997

[54] END-OF-COUNT DETECTING DEVICE FOR NONVOLATILE MEMORIES

[75] Inventors: Marco Olivo, Bergamo; Marco Maccarrone, Palestro, both of Italy

[73] Assignee: SGS-Thomson Microelectronics S.r.l., Agrate Brianza, Italy

[21] Appl. No.: 365,510

[22] Filed: Dec. 28, 1994

[30] Foreign Application Priority Data

Dec. 28, 1993 [EP] European Pat. Off. .............. 93830526

[51] Int. Cl.[6] ..................................................... G11C 8/00
[52] U.S. Cl. ...................... 365/230.06; 365/236; 365/201
[58] Field of Search ............................. 365/189.12, 201, 365/236, 230.06, 240, 78; 377/26, 54, 56, 67, 75, 28

[56] References Cited

U.S. PATENT DOCUMENTS

| | | | |
|---|---|---|---|
| 3,622,987 | 11/1971 | Borkan | 340/146.2 |
| 4,315,108 | 2/1982 | Hoffman et al. | 379/361 |
| 4,616,345 | 10/1986 | Monk | 365/230.06 |
| 4,837,748 | 6/1989 | Chung et al. | 365/236 |

FOREIGN PATENT DOCUMENTS

| | | |
|---|---|---|
| 2098921 | 3/1972 | France . |
| 2687828 | 8/1993 | France . |
| 60-100825 | 6/1985 | Japan . |

*Primary Examiner*—Joseph A. Popek
*Attorney, Agent, or Firm*— Seed and Berry LLP; David V. Carlson; Bryan A. Santarelli

[57] ABSTRACT

An end-of-count detecting device for nonvolatile memories, comprising a decoder in the form of a wired OR structure of a number of transistors of the same type, the gate terminals of which are fed with a count signal generated by a counter element and having a predetermined end-of-count value to be detected. A load, which may be static, pseudo-dynamic or dynamic, is provided between the common node of the decoder transistors and a reference potential line; and the decoder output formed by the common node assumes a different logic level according to whether or not the end-of-count value coded by the wired OR structure is reached. A number of wired OR structures may be arranged side by side with an array of transistors for detecting a number of end-of-count values of the same counter element.

28 Claims, 3 Drawing Sheets

5,594,703

END-OF-COUNT DETECTING DEVICE FOR NONVOLATILE MEMORIES

TECHNICAL FIELD

The present invention relates to an end-of-count detecting device, particularly for nonvolatile memories.

BACKGROUND OF THE INVENTION

As is known, present nonvolatile memories, particularly flash-EEPROMs, involve complex functions, e.g., for erasing, which are performed by means for a sequencer implemented by a state machine and connected to a signal interpreter. The functions to be performed involve various count operations which, to avoid an excessive increase in the number of states and complexity of the state machine, cannot be performed directly by the sequencer. For this purpose, counters or counter elements external to the sequencer are provided—one for each count function—as well as a decoder for detecting an end-of-count value and generating a signal for the state machine.

At present, the decoder is formed using single- or multi-level static CMOS logic. The single-level logic solution features an n-input (NAND or NOR) circuit for each n-bit counter or counter element, and requires, for each circuit, n N-channel and n P-channel transistors, which creates serious layout difficulties in that a solution suitable for one type of transistor (e.g., series connection) is unsuitable for the other. Moreover, the above solution is cumbersome, and further layout problems are posed by the bus resulting from the possibly large number of supply wires required for the inputs of each circuit. Also, the efficiency of the above known solution is increasingly impaired alongside an increase in the number of inputs of each circuit. To solve this problem, a multilevel logic solution may be employed featuring circuits with a small number of inputs and output-connected to other circuits. Such a solution, however, has the disadvantage of creating multiple signal levels and greatly increasing the size and complexity of the decoder.

Moreover, each count function may comprise different end-of-count values, depending upon the current state of the operations sequencer. For example, the count function relative to the number of modification pulses to be applied to the memory cells may present two different end-of-count values for the program pulses ("byte write") and the erase pulses ("sector erase"). For each end-of-count signal, the state machine therefore evolves differently. As the number of count functions and end-of-count values for each count function increases, an increasing number of inputs are required on the state machine for receiving a specific end-of-count signal, which is of course a disadvantage.

SUMMARY OF THE INVENTION

It is an object of the present invention to provide an end-of-count detecting device designed to overcome the drawbacks typically associated with known solutions.

According to the present invention, there is provided an end-of-count detecting device, particularly for nonvolatile memories, as claimed in Claim 1.

BRIEF DESCRIPTION OF THE DRAWINGS

A number of preferred, non-limiting embodiments of the present invention will be described by way of example with reference to the accompanying drawings, in which.

DETAILED DESCRIPTION OF THE INVENTION

Figure 1:
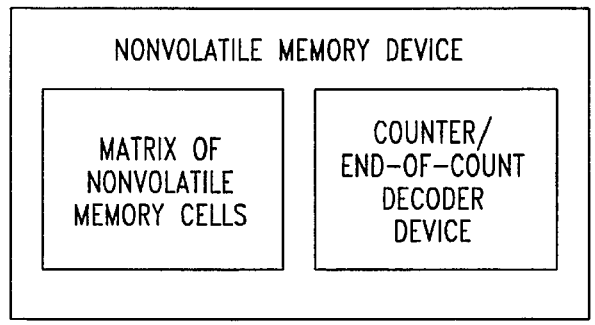
FIG. 1 is a nonvolatile memory device having a counter/end-of-count decoder in accordance with the present invention.
Figure 2:
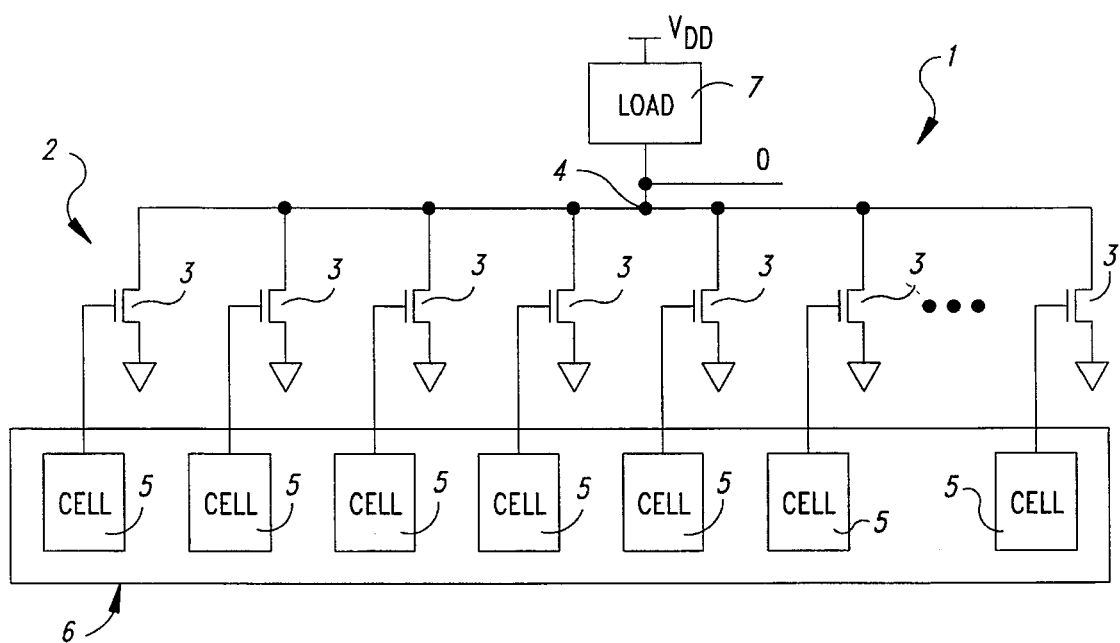
FIG. 2 shows a device in accordance with the present invention, for detecting a signal end-of-count configuration.

FIG. 1 is a block diagram of a non-volatile memory device having a matrix of non-volatile memory cells and a counter/end-of-count decoder structured according to the present invention;

FIG. 2 shows one embodiment of the counter/end-of-counter decoder of FIG. 1. Device 1 provides for detecting the end-of-count value of a predetermined count function, and comprises a structure 2 formed by the wired OR connection of a number of transistors 3 of the same type (in this case, N-channel). Transistors 3 (equal in number to the bits in the count function whose end-of-count value is to be detected) present grounded source terminals, drain terminals all connected to a node 4, and gate terminals connected to the output of respective cells 5, which may be formed in any appropriate manner, and together form an n-bit counter or counter element 6. The gate terminals of transistors 3 are connected to either the direct or inverted output of each cell, depending upon the end-of-count value implemented.

Node 4, at which signal 0 is present, represents the output of device 1, and is connected to supply line $V_{DD}$, via a load 7 comprising a resistor or permanently-on transistor that constitutes a static load.

The output signal of device 1 is low for all the output configurations of counter element 6 except the end-of-count configuration coded by wired OR structure 2. In fact, until the end-of-count value is reached, at least one of the (direct or inverted) outputs of cells 5 is high, so that a respective transistor 3 is on and node 4 grounded. Conversely, upon the end-of-count value being reached, all the output signals of cells 5 (which, as stated, may correspond to the direct or inverted value of the content of cell 5) are low, so that transistors 3 are all off, and output 4 is maintained substantially at the potential of supply line $V_{DD}$ by load 7.

The FIG. 2 device thus provides for solving the space and layout problems typical of existing static CMOS solutions, by comprising fewer transistors of the same channel type, for which the most suitable arrangement may be selected. Moreover, the device may be formed physically close to the cells, so that only one output 4 need be wired to the state machine requiring a given count function.

On the other hand, the FIG. 2 solution may be disadvantageous in terms of power consumption, due to the current flow existing when the output is low, i.e., for all but the end-of-count value condition, as stated above. In fact, with the exception of the end-of-count value, at least one path toward ground always exists through the transistor or transistors that are turned on. Moreover, as in any NMOS logic circuit, zero-to-one transition is invariably slow in that the load (with a pull-up function) must be resistive enough to ensure a good "0" value and minimize consumption as far as possible.

Figure 3:
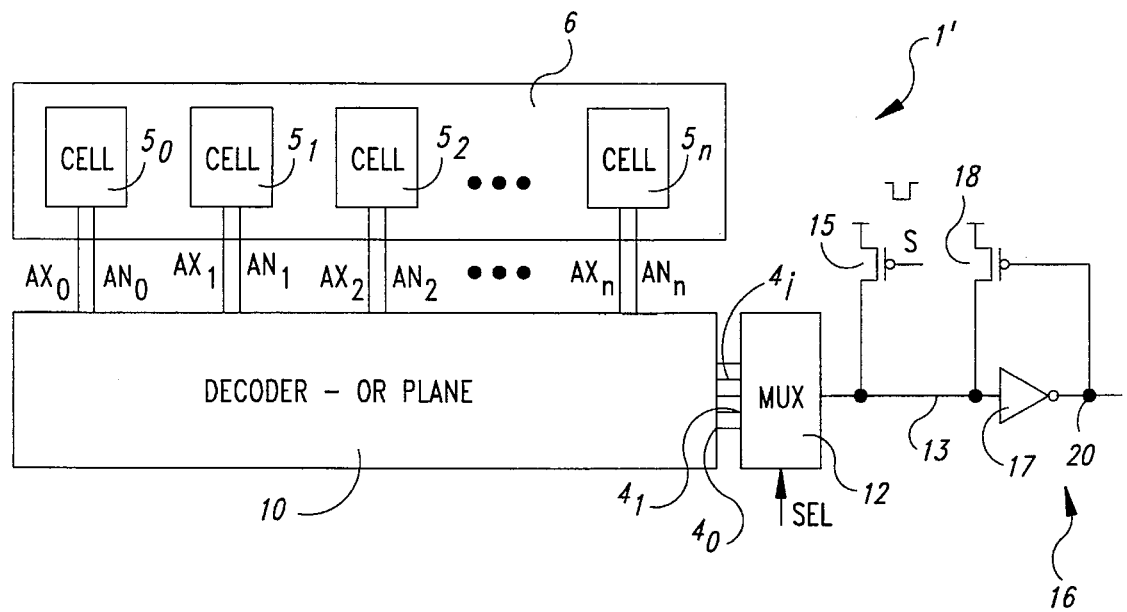
FIG. 3 shows a block diagram of a device for detecting a number of end-of-count configurations.

According to another solution, for systems synchronized by a clock signal, the static load in FIG. 2 is replaced by a pseudo-dynamic load (so-called "domino logic" solution) as shown in FIG. 3, which shows a device 1' for detecting a number of end-of-count values relative to the same count function.

In FIG. 3, the counter element, again indicated by 6, comprises a number of cells $5_i$ (where i=0, 1, 2, ... n) each presenting two outputs supplying the direct value $AX_i$ and the inverted value $AN_i$ of the content of cell $5_i$.

Device 1' comprises a decoder 10 constituting an OR plane including a number of wired OR structures 2 as in FIG. 2. Each structure 2 comprises a number of transistors, each connected to the direct or inverted output of a respective cell $5_i$ as described later on, and as shown in detail in FIG. 4 relative to two end-of-count values.

Decoder 10 presents a number of outputs $4_0', 4_1', \ldots 4_j$ (each relative to a wired OR structure) connected to a selector or multiplexer device 12 also supplied with a selection signal SEL. Multiplexer 12 presents an output 13 which is connected to a predetermined output $4_j$ of decoder 10 according to the value of selection signal SEL.

Output 13 of multiplexer 12 is connected to the drain terminal of a P-channel load transistor 15, the source terminal of which is connected to supply line $V_{DD}$, and the gate terminal of which is supplied with a precharge signal S. Output 13 is also connected to a latch element 16 composed of an inverter 17 feedback-controlled by a P-channel transistor 18 which presents the gate terminal connected to the output of inverter 17 (output node 20 of device 1'), the source terminal connected to supply line $V_{DD}$, and the drain terminal connected to output 13 of multiplexer 12.

The load of device 1' in FIG. 3 is represented by transistor 15, which presents a precharge step that is active for a limited length of time, and during which signal S is low, and transistor 15 is turned on and charges node (output) 13 substantially to the supply potential. At the end of the precharge step (when signal S switches to high), the wired OR structure whose output $4_j$ is at that time connected to output 13 of multiplexer 12 is evaluated; and output 13 only remains high if all the bits of cells 5 have reached the end-of-count value implemented by the wired OR structure in question. Conversely, if the end-of-count value implemented has not yet been reached, output 13 switches to low, with no static consumption by virtue of transistor 15 being off; and the value of output 13 is inverted by inverter 17 and locked by feedback transistor 18.

Feedback transistor 18 in the FIG. 3 circuit may be omitted for implementing a fully dynamic logic circuit wherein reading of output 20 is controlled by a clock signal for ensuring it is read at the right time.

The FIG. 3 solution (possibly with the fully dynamic variation described above) provides for greatly reducing consumption and, in the event of a number of end-of-count values, for optimizing layout, by virtue of the possibility of all the wired OR structures being located close to the corresponding cells 5 of counter element 6 and, hence, being grouped in decoder 10.

Figure 4:
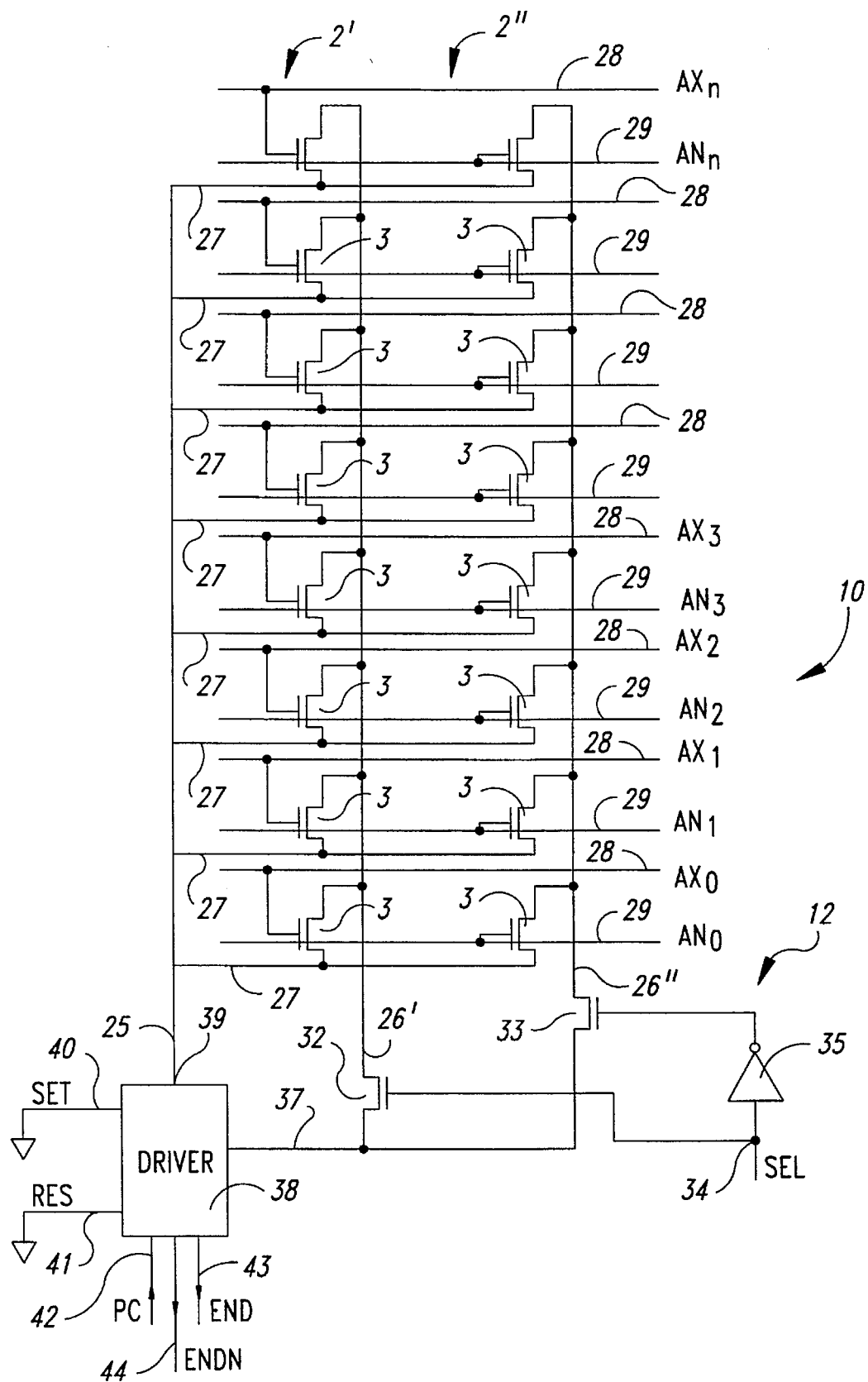
FIG. 4 shows the component layout of the FIG. 3 device.

An example of such a layout is shown in FIG. 4 described below.

The FIG. 4 arrangement relates to the detection of two different end-of-count values for a given counter element, and therefore comprises two wired OR structures 2' and 2", each composed of n+1 N-channel transistors 3 arranged in rows and columns so that the transistors in the same row receive the same count bit generated by a given cell $5_i$ (but are relative to different end-of-count values), and the transistors in the same column are relative to the same end-of-count value and receive the various bits of which it is composed. Transistors 3 of each wired OR structure are connected parallel with one another between a ground line 25 (to which they are connected by the source terminals) and a respective output line (or wired OR line) 26', 26" to which they are connected by the drain terminals. Lines 25 and 26 are arranged parallel to one another, and ground line 25 is connected to a number of source lines 27 perpendicular to line 25 and between adjacent rows of transistors 3.

A number of data lines 28 and 29, of direct and inverted value respectively, extend parallel to source lines 27 on either side of transistors 3, lines 28, 29 in each pair relative to a data item or bit being located on either side of the respective row of transistors 3. By selectively connecting the gate terminal of each transistor 3 to its data line 28 or 29, it is possible to wire any end-of-count configuration (value).

FIG. 4 also shows a simple arrangement of multiplexer 12 which in this case is composed of two selection transistors 32, 33 on respective lines 26' and 26". Transistors 32 presents the gate terminal connected directly to a node 34 supplied with a digital selection signal SEL; while transistor 33 is connected to node 34 via an inverter 35, so that transistors 32 and 33 receive opposite-phase turn-on signals.

The terminals of transistors 32, 33 not connected to lines 26', 26" are both connected to terminal 37 of a driver 38 comprising the precharge transistor 15 and latch 16 in FIG. 3. Driver 38, an embodiment of which is shown in FIG. 5, presents a terminal 39 connected to ground line 25 for providing a switched ground; grounded set and reset inputs 40 and 41; an input 42 for precharge signal PC (similar but opposite in phase to signal S in FIG. 3); and a pair of outputs 43 and 44 respectively presenting an end-of-count signal END and inverted end-of-count signal ENDN.

In the FIG. 4 circuit, driver 38 enables the precharge step on receiving a precharge signal PC of a given level. At the same time, selection signal SEL selects the desired end-of-count value which selectively turns on transistor 32 or 33. At this step, line 25 is not connected to ground. At the end of the precharge step, in which the selected output line 26', 26" is switched to high, the output of register 6 (FIG. 2) is evaluated by means of signals $AX_i$, $AN_i$, and line 25 is grounded. Depending on the gate terminal connection of transistors 3 of the selected structure 2', 2", if even only one of transistors 3 of the selected structure 2', 2" receives a high signal at the gate terminal, it connects switched ground line 25 to output line 26' or 26", thus switching end-of-count signal END. Conversely, if the end-of-count value is reached, none of transistors 3 of selected structure 2', 2" is turned on, and the END output remains at its former level.

Figure 5:
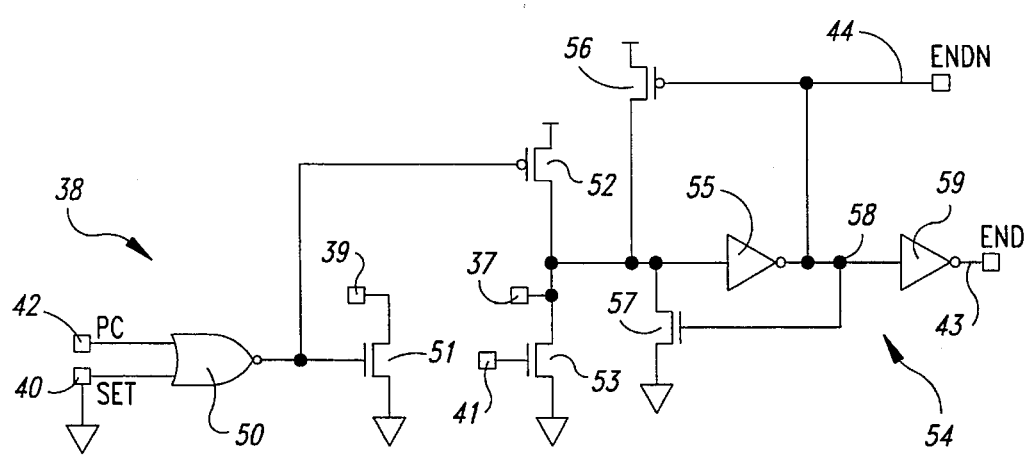
FIG. 5 shows the circuit diagram of a component in FIG. 4.

FIG. 5 shows an example embodiment of driver 38 which comprises a NOR circuit 50 supplied with precharge signal PC and a SET signal (in this case, grounded). The output of NOR circuit 50 is connected to the gate terminal of a ground switching transistor 51—in this case, an N-channel transistor—the source terminal of which is grounded, and the drain terminal of which defines output 39 of driver 38 and is therefore connected to switched ground line 25 (FIG. 4). The output of NOR circuit 50 is also connected to the drain terminal of a P-channel precharge transistor 52 (corresponding to transistor 15 in FIG. 3) having the source terminal connected to supply line $V_{DD}$, and the drain terminal connected to terminal 37 of driver 38. Terminal 37 is also grounded by an N-channel reset transistor 53 having the gate terminal connected to reset input 41 of driver 38 (and, in this case, grounded for maintaining transistor 53 permanently off). Terminal 37 is also connected to an output latch 54 comprising an inverter 55 input-connected to terminal 37, and a pair of transistors 56, 57 of opposite types, for maintaining the output data of inverter 55. More specifically, transistor 56 is a P type with the gate terminal connected to the output node 58 of inverter 55, the source terminal connected to supply line $V_{DD}$, and the drain terminal connected to terminal 37; while transistor 57 is an N type with the gate terminal connected to node 58, the drain terminal connected to terminal 37, and a grounded source terminal.

Node 58 is connected to an inverter 59, the output of which defines output 43 of driver 38 (FIG. 4) having the END signal thereon; while node 58 itself defines output 44 having the ENDN signal thereon.

In the FIG. 5 circuit, at the precharge step, the PC signal is high so that transistor 51 is off; transistor 52 is on; node 37 and output 43 (END signal) are high; and, transistor 51 being off, the source terminals of transistors 3 of the selected structure 2', 2" are not connected to ground, thus preventing static consumption during this step. The precharge step permits outputs $AX_i$, $AN_i$ of cells 5 (FIG. 3) to switch with no spurious effects (alee) at the END output which remains safely at "1" throughout the precharge step. At the end of the precharge step, the PC signal switches to low; and the output of NOR circuit 50 switches to high, thus turning off precharge transistor 52 and turning on transistor 51 which grounds line 25 and all the source terminals of transistors 3. The selected structure 2', 2" may thus be evaluated, and, if signals $AX_i$, $AN_i$ present the coded end-of-count configuration, none of them is conductive, and terminal 37 remains high, thus maintaining a high END signal. Conversely, if the end-of-count value has not been reached, inverters 55 and 59 switch, followed by switching of the END signal.

Transistors 56, 57 provide for maintaining the output of inverter 55 (and hence the END signal) in its present state in the absence of a definite signal at terminal 37. In particular, transistor 57 provides for maintaining the END signal low in the absence of both the precharge step and a ground path of terminal 37, as in the power-up step of the end-of-count detecting device.

The FIG. 5 circuit has a number of design provisions as regards transistors 56 and 57, which are resistive enough to permit trouble-free charging of latch 54 at both the precharge step (when transistor 52 is turned on and possibly required to overcome the "0" at terminal 37) and the evaluation step (when the series connection of ground switching transistor 51 and any transistors 3 that are turned-on is required to overcome the "1" at terminal 37 generated by precharge transistor 52 and maintained by latch transistor 56).

Driver 38 in FIGS. 4 and 5 presents SET and RES signal feeding inputs which are not used in the embodiment shown, but which may prove useful in particular applications for setting or resetting the driver.

The advantages of the end-of-count detecting device according to the present invention will be clear from the foregoing description. In particular, the wired OR structure design of the decoder provides for solving the decoder layout, size and efficiency problems mentioned above, even in the event of a large number of count function bits.

Moreover, in the event of a number of end-of-count values, the multiplexed OR plane design of the decoder (as described with reference to FIG. 4) provides for minimizing the connecting lines (wires) between the device and relative state machine, thus enabling space-saving and considerable advantages in terms of layout. The arrangement shown also provides for trouble-free programming of any configuration by appropriately connecting the data or inverted data lines and the gate terminals of the transistors, with no need for a special layout for each configuration.

Finally, the decoder may be formed physically close to the respective counter or counter element, thus eliminating the need for extensive wire or bus connections between the two.

It will be clear that changes may be made to the device as described and illustrated herein without, however, departing from the scope of the present invention. In particular, and as already stated, the wired OR structure according to the invention may be implemented with a static, pseudo-dynamic (domino logic+output latch) or fully dynamic load. Also, as opposed to that described, the wired OR structure may be formed in dual manner, with complemented-logic P-channel transistors (grounded precharge, and evaluation which, in the presence of even only one turned-on transistor, switches the output to high, up to the supply voltage).

In the solution with a number of end-of-count values for the same count function (same counter), the end-of-count value to be detected each time may be selected even downstream from the load or precharge transistor, so that each decoded end-of-count configuration would be assigned its own load. Finally, in the case of a number of count functions, decoder 10 may comprise a number of decoding functions, each with its own driver, output and selection circuit, or with appropriately multiplexer shared circuits.

We claim:

1. An end-of-count detecting device, particularly for nonvolatile memories, comprising decoding means having input terminals supplied with count signals, for generating an end-of-count signal on detecting predetermined configurations of said count signals; characterized by the fact that said decoding means comprise a wired OR structure for each said predetermined configuration.

2. A detecting device as claimed in claim 1, characterized by the fact that said wired OR structure comprises a number of transistors having a first, a second and a control terminal; said first terminals being connected jointly to a first reference potential line; said second terminals being connected jointly to an output node; and said control terminals each receiving a respective count signal; said output node being connected to a second reference potential line via a load element.

3. A detecting device as claimed in claim 2, characterized by the fact that said load is a static load including a nonswitched resistive element.

4. A detecting device as claimed in claim 2, characterized by the fact that said load is a switched load.

5. A detecting device as claimed in claim 4, characterized by the fact that said switched load comprises a switch element having a control terminal supplied with a turn-on signal for charging said output node via said second reference potential line during a precharge step, and for disconnecting said output node from said second reference potential line during an evaluation step of said count signals.

6. A detecting device as claimed in claim 5, characterized by the fact that the detecting device comprises a storage device connected to said output node.

7. A detecting device as claimed in claim 2, characterized by the fact that the detecting device comprises a number of wired OR structures having common input terminals for decoding different end-of-count configurations.

8. A detecting device as claimed in claim 7, characterized by the fact that said number of wired OR structures are arranged in an array with transistors relative to the same wired OR structure aligned parallel to a first direction, and transistors relative to different wired OR structures supplied with the same count signal aligned parallel to a second direction substantially perpendicular to said first direction.

9. A detecting device as claimed in claim 8, characterized by the fact that said array comprises a pair of complemented data lines for each said count signal; and a number of wired OR lines, one for each wired OR structure, connected to said second terminal of said transistors; said pairs of data lines extending parallel to said second direction; and said wired OR lines extending parallel to said first direction.

10. A detecting device as claimed in claim 7, characterized by the fact that the detecting device comprises a selecting device interposed between said number of wired OR structures and an output terminal of said detecting device, for selectively connecting one of said wired OR structures to said output terminal.

11. A detecting device as claimed in claim 10, characterized by the fact that said selecting device is located between said number of wired OR structures and said load.

12. A detecting device as claimed in claim 2, characterized by the fact that the detecting device comprises a controlled switch interposed between said first terminals of said transistors and said first reference potential line.

13. A counting device, comprising:

a counter operable to generate a count value; and a wired-OR decoder in communication with said counter and operable to generate at an output terminal an end-of-count signal when said count value equals an end-of-count value.

14. The device of claim 13, further comprising a load coupled between said output terminal and a supply voltage.

15. The device of claim 13, further comprising a precharge switch operable to precharge said output terminal to a predetermined value in response to a precharge signal.

16. The device of claim 15, further comprising a latch operable to store a value occupying said output terminal.

17. The device of claim 13, further comprising:

said decoder operable to generate one of a number of end-of-count signals when said count equals a corresponding one of said number of end-of-count values; and a multiplexer for coupling said one end-of-count signal to said output terminal in response to a select signal.

18. The device of claim 13, further comprising:

said counter having a number of count elements each operable to generate a bit of said count value; and said decoder having said number of transistors each having a control terminal coupled to a corresponding one of said count elements, a first terminal coupled to a reference potential, and a second terminal coupled to said output terminal.

19. The device of claim 13, further comprising:

said counter comprising a number of count elements each operable to generate a bit of said count value; and said decoder comprising, a column having said number of transistors and operable to generate said end-of-count signal, and each of said transistors associated with a bit and an inverse bit line from a corresponding one of said counter elements and having a control terminal coupled to either said bit or inverse bit line, a first terminal coupled to a reference value, and a second terminal coupled to said output terminal.

20. A nonvolatile memory, comprising:

a matrix of nonvolatile memory cells; and a counting device, comprising, a counter operable to generate a count value; and a wired-OR decoder in communication with said counter and operable to generate at an output terminal an end-of-count signal when said count value equals an end-of-count value.

21. The memory of claim 20 wherein said counting device further comprises a precharge switch operable to precharge said output terminal to a predetermined value in response to a precharge signal.

22. The memory of claim 21 wherein said counting device further comprises a latch operable to maintain a value on said output terminal.

23. The memory of claim 20 wherein said counting device further comprises:

said decoder operable to generate one of a first number of end-of-count signals when said count value equals a corresponding one of said first number of end-of-count values; and a multiplexer having said first number of input terminals and operable to couple said one end-of-count signal to said output terminal in response to a select signal.

24. The memory of claim 23 wherein said counting device further comprises:

said counter having a second number of count elements each operable to generate a bit of said count value;

said decoder having said first number of columns of said second number of transistors, each column for generating one of said end-of-count signals on a corresponding one of said multiplexer inputs, each transistor having a control terminal coupled to a corresponding one of said count elements, a first terminal, and a second terminal coupled to a corresponding one of said multiplexer input terminals; and a driver having an input terminal coupled to said multiplexer, a drive terminal coupled to said output terminal, and a precharge terminal operable to receive a precharge signal, said driver comprising, a precharge switch operable to precharge said driver input terminal to a predetermined value when said precharge signal is in a first state, a reference switch operable to couple the first terminals to a reference potential when said precharge signal is in a second state, and a latch coupled between said precharge terminal and said drive terminal.

25. The memory of claim 23, further comprising:

said counter comprising a second number of count elements each operable to generate a bit of said count value; and said decoder comprising, said first number of columns each having said second number of transistors, each of said columns operable to generate one of said end-of-count signals, said second number of rows formed from adjacent ones of said transistors from adjacent ones of said columns, each of said rows associated with a bit and an inverse bit line from a corresponding one of said counter elements, and each transistor within said each row having a control terminal coupled to either said bit or inverse bit line, a first terminal coupled to a reference potential, and a second terminal coupled to a corresponding one of said multiplexer input terminals.

26. The memory of claim 20 wherein said counting device further comprises:

said counter having a number of count elements each operable to generate a bit of said count value; and said decoder having said number of transistors each having a control terminal coupled to a corresponding one of said count elements, a first terminal coupled to a reference potential, and a second terminal coupled to said output terminal.

27. A method for counting, comprising:

generating a count value having a number of bits with a counter having said number of count elements that each provide a corresponding one of said bits at a bit output; and connecting said bit outputs directly to an output terminal to generate thereon an end-of-count signal when said count value equals an end-of-count value.

28. The method of claim 27, further comprising:

receiving a precharge signal; and precharging said output terminal to a predetermined value in response to a first state of said precharge signal.

* * * * *